United States Patent
Takagi et al.

(10) Patent No.: US 7,773,652 B2
(45) Date of Patent: Aug. 10, 2010

(54) GAIN-COUPLED DISTRIBUTED FEEDBACK SEMICONDUCTOR LASER HAVING AN IMPROVED DIFFRACTION GRATING

(75) Inventors: Kazuhisa Takagi, Tokyo (JP); Keisuke Matsumoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 636 days.

(21) Appl. No.: 11/475,136

(22) Filed: Jun. 27, 2006

(65) Prior Publication Data

US 2007/0195849 A1    Aug. 23, 2007

(30) Foreign Application Priority Data

Feb. 22, 2006    (JP)    .............. 2006-045726

(51) Int. Cl.
*H01S 5/00*    (2006.01)
(52) U.S. Cl. .............. 372/50.11; 372/29.023; 372/99; 372/102; 372/29.011
(58) Field of Classification Search .............. 372/50.11, 372/29.023, 99, 102, 29.011
See application file for complete search history.

(56) References Cited

U.S. PATENT DOCUMENTS

| | | | | |
|---|---|---|---|---|
| 541,802 | A * | 6/1895 | Chwalch | 446/146 |
| 4,796,273 | A * | 1/1989 | Yamaguchi | 372/96 |
| 4,958,357 | A * | 9/1990 | Kinoshita | 372/96 |
| 5,418,802 | A * | 5/1995 | Chwalek | 372/20 |
| 5,926,497 | A * | 7/1999 | Nitta et al. | 372/96 |
| 6,307,989 | B1 | 10/2001 | Kinoshita | |
| 6,577,660 | B1 * | 6/2003 | Muroya | 372/50.11 |
| 6,587,619 | B1 * | 7/2003 | Kinoshita | 385/37 |
| 6,704,335 | B1 * | 3/2004 | Koyama et al. | 372/43.01 |
| 6,743,648 | B2 * | 6/2004 | Kise et al. | 438/22 |
| 6,885,686 | B2 * | 4/2005 | Botez | 372/43.01 |
| 7,180,930 | B2 * | 2/2007 | Takaki et al. | 372/96 |
| 2001/0026671 | A1 * | 10/2001 | Kinoshita | 385/129 |
| 2001/0043384 | A1 * | 11/2001 | Ishizaka | 359/248 |
| 2002/0024983 | A1 * | 2/2002 | Sato | 372/45 |
| 2003/0008428 | A1 * | 1/2003 | Tsukiji et al. | 438/29 |
| 2003/0091080 | A1 * | 5/2003 | Aoyagi et al. | 372/45 |
| 2003/0103538 | A1 * | 6/2003 | White | 372/45 |
| 2003/0147439 | A1 * | 8/2003 | Shams-Zadeh-Amiri et al. | 372/45 |

(Continued)

FOREIGN PATENT DOCUMENTS

| | | | |
|---|---|---|---|
| JP | 2000-137126 | | 5/2000 |
| JP | 2002-353559 | * | 6/2002 |

OTHER PUBLICATIONS

JP2002-353559 (Translation) pp. 1-15.*

(Continued)

*Primary Examiner*—Minsun Harvey
*Assistant Examiner*—Delma R Forde
(74) *Attorney, Agent, or Firm*—Leydig, Voit & Mayer, Ltd.

(57) ABSTRACT

In a gain-coupled distributed feedback semiconductor laser, a coating of a low reflectivity is provided on a front facet from which laser light is emitted and a coating of a high reflectivity is provided on a rear facet, thus forming asymmetric coatings. The semiconductor laser has a structure in which an absorption diffraction grating is located along an optical waveguide, and the diffraction grating includes a phase shift region.

2 Claims, 3 Drawing Sheets

U.S. PATENT DOCUMENTS

2004/0190580 A1* 9/2004 Pezeshki et al. ............ 372/96
2004/0258119 A1* 12/2004 Shams-Zadeh-Amiri
 et al. ......................... 372/45
2005/0053112 A1* 3/2005 Shams-Zadeh-Amiri ..... 372/96
2007/0133648 A1* 6/2007 Matsuda et al. ............. 372/102

OTHER PUBLICATIONS

Nakano et al., "Reduction of Excess Intensity Noise Induced by External Reflection in a Gain-Coupled Distributed Feedback Semiconductor Laser", IEEE Journal of Quantum Electronics, vol. 27, No. 6, Jun. 1991, pp. 1732-1735.

* cited by examiner

US 7,773,652 B2

GAIN-COUPLED DISTRIBUTED FEEDBACK SEMICONDUCTOR LASER HAVING AN IMPROVED DIFFRACTION GRATING

BACKGROUND OF THE INVENTION

1. Field of the Invention

The present invention relates to a gain-coupled distributed feedback semiconductor laser and, more particularly, to a gain-coupled distributed feedback semiconductor laser used as a light source for optical fiber communication or the like.

2. Background Art

In recent years, a gain-coupled distributed feedback semiconductor lasers (DFB-LDs) have been used as a light source for transmission of a large amount of data in optical fiber communication or the like. For example, a gain-coupled distributed feedback semiconductor laser is disclosed in IEEE JOURNAL OF QUANTUM ELECTRONICS. VOL. 27, NO. 6 JUNE 1991, pp. 1732-1735, Nakano et al., "Reduction of Excess Intensity Noise Induced by External Reflection in a Gain-Coupled Distributed Feedback Semiconductor Laser".

A gain-coupled DFB-LD is formed, for example, by using a p-InP substrate. An example of the structure of the DFB-LD as viewed in a section in a direction from a resonator facet side will be described. A p-InP cladding layer is provided on the p-InP substrate ("p-" denotes the p-type and "n-" denotes the n-type in the following description). An InGaAsP-MQW active region, an n-InP intermediate layer, an n-InGaAs absorption-type diffraction grating and an n-InP capping layer laid one on another with a predetermined thickness are formed on the p-InP cladding layer. A current blocking layer including a p-InP blocking layer, an n-InP blocking layer and a p-InP blocking layer laid one on another are embedded on both sides of the above-described layers. An n-InP contact layer is provided on the current blocking layer and the n-InP capping layer. A silicon oxide film is formed on the n-InP contact layer. An opening is provided in the silicon oxide film so that the upper surface of the n-InP contact layer is exposed. A Ti/Au top electrode (n-electrode) is provided on the silicon oxide film so as to fill the opening. A Ti/Au bottom electrode (p-electrode) is provided on the back surface of the p-InP substrate.

A front facet (laser light emission facet) is provided at one end of the resonator of the above-described DFB-LD, and a rear facet is provided at the other end. Low-reflectivity coating films are formed on the front and rear facets.

The above-described n-InGaAs absorption-type diffraction grating selects laser light of a predetermined oscillation wavelength generated in the MQW active region to improve single-mode yield at the oscillation wavelength.

In the above-described conventional gain-coupled DFB-LD, there is a need to provide a low-reflectivity coating on each of the front and rear facets in order to achieve the single-mode oscillation operation. Laser light is evenly emitted from the front and rear facets with the low-reflectivity coatings. Therefore the efficiency of optical output from the front facet to injected current is low.

If a low-reflectivity coating and a high-reflectivity coating are provided on the front facet and the rear facet, respectively, (that is, asymmetric coatings are provided) to obtain a sufficient optical output from the front facet, laser light is oscillated in two modes. In such a case, a stable operation with a single wavelength cannot be achieved and the laser cannot be used for optical fiber communication.

SUMMARY OF THE INVENTION

The present invention has been developed to solve the above-described problems, and therefore it is an object of the present invention to provide a gain-coupled distributed feedback semiconductor laser in which the oscillation wavelength single-mode yield is increased and the efficiency of output at the front facet is also increased.

The above object is achieved by a gain-coupled distributed feedback semiconductor laser that includes an optical waveguide through which laser light travels, a diffraction grating with an absorbing portion which selects laser light with a predetermined oscillation wavelength provided along the optical waveguide, a front facet with a first reflectivity provided at one end of the optical waveguide emitting the laser light, and a rear facet with a second reflectivity higher than the first reflectivity provided at the other end of the optical waveguide, wherein a phase shift region is provided in the diffraction grating.

According to the present invention, in a gain-coupled distributed feedback semiconductor laser, the oscillation wavelength single-mode yield can be increased and the efficiency of output at the front facet can also be increased.

Other features and advantages of the invention will be apparent from the following description taken in connection with the accompanying drawings.

DETAILED DESCRIPTION OF THE PREFERRED EMBODIMENTS

Figure 1:
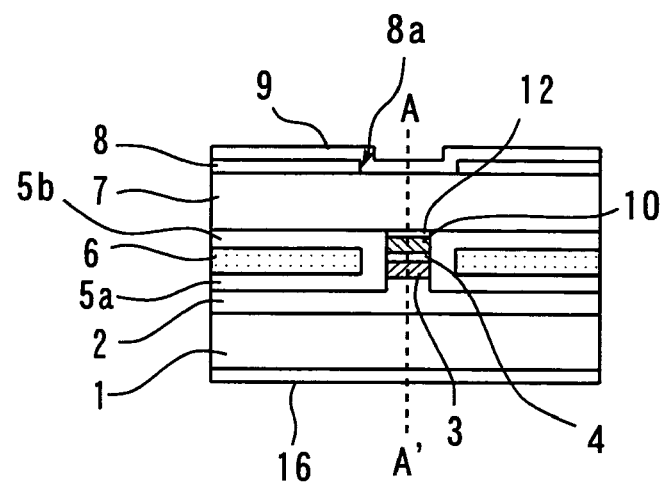
FIG. 1 is a sectional view seen from the front facet of a gain-coupled distributed feedback semiconductor laser.

Embodiments of the present invention will be described below referring to the drawings. In the drawings, the same or equivalent parts will be denoted by the same reference numerals, and the description thereof will be simplified or omitted.

First Embodiment

A gain-coupled distributed feedback semiconductor laser (hereinafter referred to as "DFB-LD") according to a first embodiment of the present invention will be described.

The structure of the DFB-LD will first be described. FIG. 1 shows a sectional view seen from the front facet (laser light emission surface) of the semiconductor laser, i.e., a sectional view perpendicular to the longitudinal direction of a resonator. This semiconductor laser is formed by using a p-InP substrate 1. A p-InP cladding layer 2 is provided on the p-InP substrate 1. A multilayer film having an InGaAsP multiple quantum well (InGaAsP-MQW) active region 3, an n-InP intermediate layer 4, an n-InGaAs absorption-type diffraction grating 10 and an n-InP capping layer 12 laid one on another with a predetermined thickness is formed on the p-InP cladding layer 2. (The InGaAsP-MQW active region 3 will be referred to simply as "active region 3".)

A current blocking layer including a p-InP blocking layer 5a, an n-InP blocking layer 6 and a p-InP blocking layer 5b laid one on another is embedded on both sides of the multilayer film. An n-InP contact layer 7 is provided on the current blocking layer and the n-InP capping layer 12. A silicon oxide film 8 is formed on the n-InP contact layer 7. An opening 8a is provided in the silicon oxide film 8 at a center of the same. The upper surface of the n-InP contact layer 7 is exposed in the opening 8a. A Ti/Au top electrode (n-electrode) 9 is provided on the silicon oxide film 8 so as to fill the opening 8a. A Ti/Au bottom electrode (p-electrode) 16 is provided on the back surface of the p-InP substrate 1.

Figure 2:
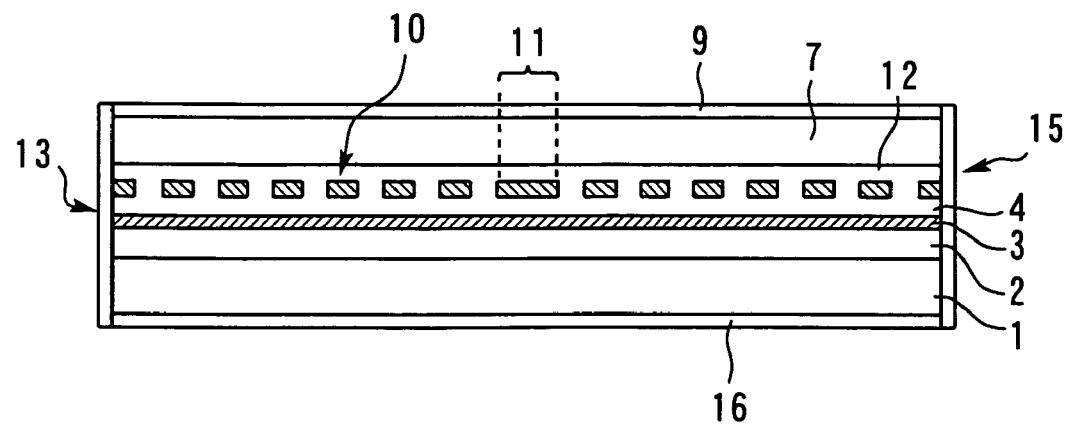
FIG. 2 is a sectional view along the longitudinal direction of the resonator of a gain-coupled distributed feedback semiconductor laser.

FIG. 2 shows a sectional view taken along line A-A' of FIG. 1, i.e., a sectional view along the longitudinal direction of the resonator of the DFB-LD. As shown in FIG. 2, the active region 3 extends along the longitudinal direction of the resonator. Laser light is generated in the active region 3 and travels along the longitudinal direction of the active region 3. That is, the active region 3 is an optical waveguide through which laser light travels. A front facet 13 is provided at one end of the active region 3 (optical waveguide) in the longitudinal direction, while a rear facet 15 is provided at the other end. The front facet 13 is a surface from which laser light generated in the active region 3 is emitted. The rear facet 15 is provided opposite from the front facet 13 as a surface for reflecting laser light traveling through the DFB-LD.

A diffraction grating 10 is provided on the active region 3 along the longitudinal direction of the active region 3, i.e., the optical waveguide direction. The diffraction grating 10 extends from the front facet 13 to the rearfacet 15, has a plurality of grating elements, and has a band gap wavelength of 1.62 μm. A phase shift region 11 defined so that the period of diffraction grating 10 is shifted by a phase of $\lambda/4$ is provided at about a center of the diffraction grating 10. Absorbing diffraction grating 10 selects laser light of a predetermined oscillation wavelength based on the grating elements that are periodically located along the optical waveguide direction.

A coating having a low-reflectivity of 0 to 3% (first reflectivity) is provided on the front facet 13, while a coating having a high-reflectivity of 90 to 98% (second reflectivity) is provided on the rear facet 15. That is, the DFB-LD shown in FIG. 2 has the front facet 13 having the first reflectivity and provided at one end of the optical waveguide to emit the laser light generated in the active region 3 and the rear facet 15 having the second reflectivity higher than the first reflectivity and provided at the other end of the optical waveguide. Thus, asymmetric coatings having different reflectivities are provided on the front and rear facets 13 and 15 to increase the output of laser light emitted from the front facet 13 while limiting the output of laser light emitted from the rear facet 15. As a result, the efficiency of optical output from the front facet 13 is increased to a current injection into the active region 3.

In this embodiment, asymmetric coatings are provided on the front and rear facets 13 and 15. In this case, if no phase shift region is provided in the diffraction grating, the laser light is oscillated in two modes and the laser device is incapable operating with stability with a single wavelength. However, the phase shift region 11 defined so that the period of the diffraction grating 10 is shifted by a phase of $\lambda/4$ is provided at about the center of the diffraction grating 10, as shown in FIG. 2, thereby enabling the DFB-LD to have an improved single-mode characteristic.

When the above-described semiconductor laser is operated, a positive voltage is applied to the p-electrode 16 and a negative voltage is applied to the n-electrode 9. Then, holes are injected from the p-InP cladding layer 2 side into the active region 3 and electrons are injected from the n-InP capping layer 12 side to the active region 3. The holes and the electrons couple with each other to generate laser light in the active region 3. The laser light travels along the longitudinal direction (optical waveguide) of the active region 3 shown in FIG. 2 to be emitted through the front facet 13.

In the operation of the DFB-LD, two modes of oscillation of laser light with different wavelengths, i.e., primary and secondary modes, exist. Laser oscillation of light in each of these modes occurs when the gain in the optical waveguide becomes larger than the threshold gain of the mode. Therefore, a higher single-mode characteristic is obtained if the difference between the threshold gain of the primary mode and the threshold gain of the secondary mode (hereinafter referred to as "threshold gain difference") is increased. It is considered here that an improved single-mode characteristic can be obtained when the threshold gain difference is 0.1 or larger.

Figure 3:
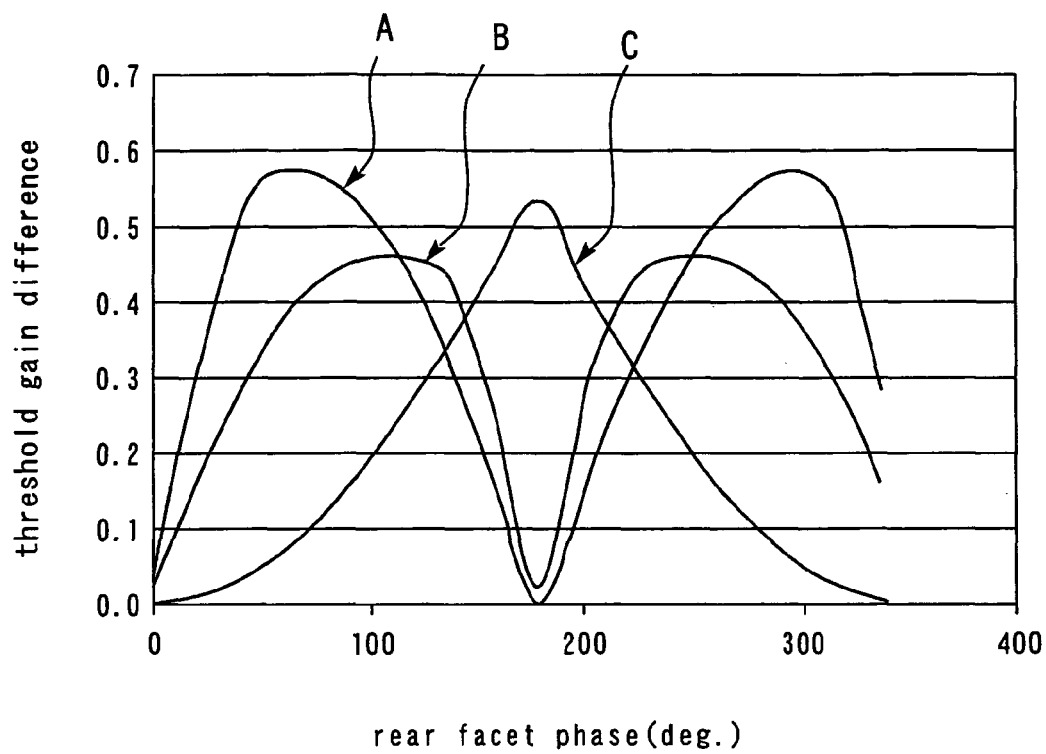
FIG. 3 shows the threshold gain difference when the position of the phase shift region is changed.

The relationship between the above-described threshold gain difference and the position of the phase shift region 11 shown in FIG. 2 will be described. In the structure shown in FIG. 2, the phase shift region 11 is placed generally at the center of the optical waveguide. The phase shift region 11 may be provided at a position different from the described above, e.g., a position at a certain distance from the center of the optical waveguide on the front facet 13 side or a position at a certain distance from the center of the optical waveguide on the rear facet 15 side. FIG. 3 shows the threshold gain difference when the position of the phase shift region is changed as described above. The threshold gain difference is plotted versus the rear facet phase shown on the abscissa with respect to a case (A) where the phase shift region is placed at about the center of the optical waveguide, a case (B) where the phase shift region is placed at a certain distance from the center of the optical waveguide on the front facet side and a case (C) where the phase shift region is placed at a certain distance from the center of the optical waveguide on the rear facet side. In the cases A and B, the threshold gain difference is 0.1 or larger except for a singular point corresponding to amounts of phase rotation on the rear facet of about 0 degrees and 180 degrees. The range of rear facet phase in which the threshold gain difference is 0.1 or larger in the cases A and B is larger than that in the case C. That is, an improved single-mode characteristic is obtained in the cases A and B in comparison with the case C.

Figure 4:
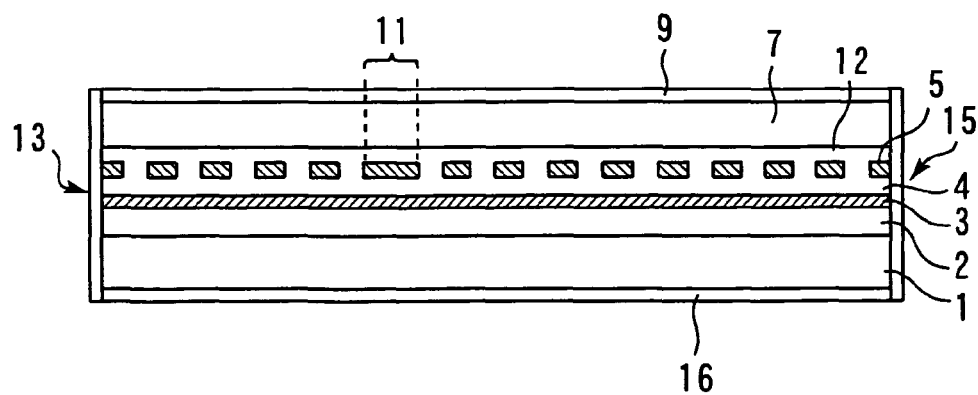
FIG. 4 is a sectional view of a gain-coupled distributed feedback semiconductor laser when the position of the phase shift region is set near the front facet.

In the case where the position of the phase shift region is set about the center of the optical waveguide (see FIG. 2) or in the case where the position of the phase shift region is set at a certain distance from the center of the optical waveguide on the front facet 13 as shown in FIG. 4, an improved single-mode characteristic can be obtained. That is, an improved single-mode characteristic can be obtained by setting the distance between the phase shift region 11 and the front facet 13 substantially equal to or smaller than the distance between the phase shift region 11 and the rear facet 15. In this way, the oscillation wavelength single-mode yield is improved.

As described above, according to this embodiment, the oscillation wavelength single-mode yield and the efficiency of output on the front facet can be improved in the gain-coupled distributed feedback semiconductor laser.

Second Embodiment

Figure 5:
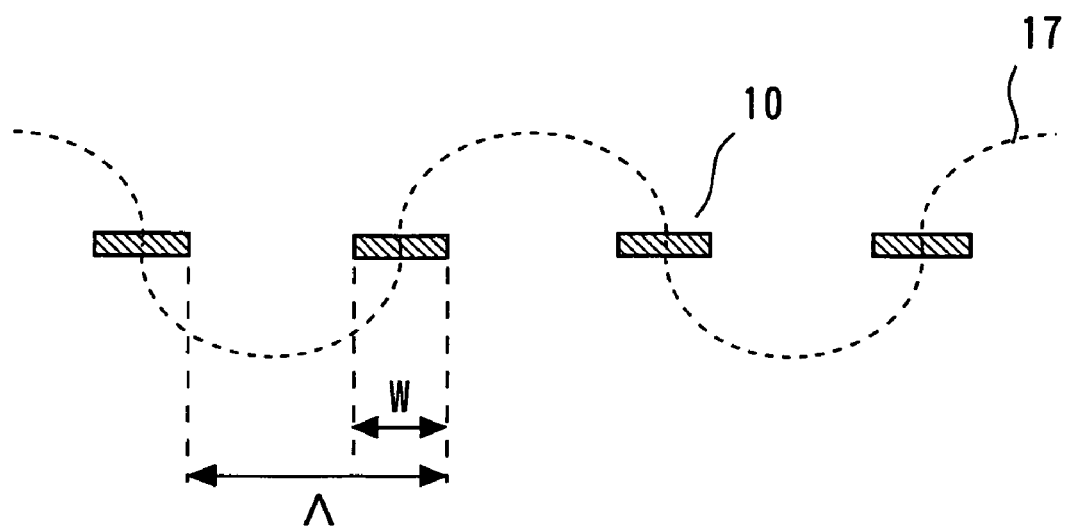
FIG. 5 shows an enlarged view of the diffraction grating of a gain-coupled distributed feedback semiconductor laser.

A DFB-LD according to a second embodiment of the present invention will be described. Description will be made mainly of the difference of the second embodiment from the first embodiment. FIG. 5 shows an enlarged view of the diffraction grating 10 shown in FIG. 2. The diffraction grating 10 has a fixed coupling constant and is formed of many grating elements, arranged with a period Λ along the optical waveguide. In the second embodiment, if the length of the grating element is W, the duty ratio (W/Λ), i.e., the quotient of the length W divided by the period Λ is smaller than ½ (smaller than 0.5). In other respects, the second embodiment is the same as the first embodiment.

When laser light oscillation continues, an optical standing wave 17 exists in the resonator. The proportion of the diffraction grating 10 existing at the position corresponding to the top of the optical standing wave 17 at this time is reduced if the diffraction grating has the above-described structure. In this way, the efficiency in the laser light optical output characteristics can be improved. Thus, an improvement in the efficiency in the laser light optical output characteristics is achieved as well as the effects of the first embodiment.

An example of a modification of the above-described second embodiment will be described. In the modification, the diffraction grating 10 is constructed so that the duty ratio W/Λ of the diffraction grating 10 is lower than ½ through the entire diffraction grating, and so that a first region in which the duty ratio W/Λ is increased relative to that in other regions is provided in a part of the diffraction grating 10. The first region is provided adjacent to or in contact with the front facet 13. For example, the first region is provided as a region having a duty ratio W/Λ of 0.45 to 0.49 in the vicinity of the front facet 13 of the diffraction grating 10 shown in FIG. 2. The portions other than this region have a duty ratio W/Λ lower than that of the first region, e.g., about 0.4.

The diffraction grating 10 shown in FIGS. 2 and 4 is an absorption-type diffraction grating which selects laser light of a predetermined oscillation wavelength. The diffraction grating 10 can therefore absorb return light (light returning to the DFB-LD by reflection or the like in the laser light emitted from the front facet). Accordingly, the diffraction grating constructed as described above can absorb light of a phase different from that of the standing wave in the return light entering the DFB-LD, thus achieving an improvement in return light resistance of the DFB-LD as well as the effects obtained in the second embodiment.

In the above-described embodiments, an electron beam lithography (EB lithography) or the like is used for lithography in forming the phase shift region of the diffraction grating. Also, λ/4 thick film of alumina or the like is used as the material of the low-reflectivity coating on the front facet. A multilayer film, e.g., one in which silicon oxide film and silicon film are alternately formed one on another is used as the material of the high-reflectivity coating on the rear facet.

While the embodiments have been described with respect to the DFB-LD having an oscillation wavelength of 1.3 μm, the present invention can also be applied to semiconductor lasers oscillating with other wavelengths, e.g., 1.49 μm and 1.55 μm.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2006-045726, filed on Feb. 22, 2006 including specification, claims, drawings and summary, on which the Convention priority of the present application is based, are incorporated herein by reference in its entirety.

The invention claimed is:

1. A gain-coupled distributed feedback semiconductor laser comprising:
    an optical waveguide through which laser light travels;
    a diffraction grating with an absorbing portion which selects laser light with a predetermined oscillation wavelength, located along the optical waveguide;
    a front facet covered with a first coating having a first reflectivity, located at a first end of the optical waveguide, where the laser light is emitted; and
    a rear facet coated with a second coating having a second reflectivity, higher than the first reflectivity, located at a second end of the optical waveguide, wherein
    the optical waveguide and the diffraction grating extend to the rear facet,
    the diffraction grating includes a phase shift region in which the period of the diffraction is shifted by a phase of λ/4, and
    distance between the phase shift region and the front facet is smaller than distance between the phase shift region and the rear facet.

2. The gain-coupled distributed feedback semiconductor laser according to claim 1, wherein the optical waveguide and the diffraction grating extend to the front facet.

* * * * *